United States Patent [19]

Chatterjee et al.

[11] 4,203,125

[45] May 13, 1980

[54] BURIED STORAGE PUNCH THROUGH DYNAMIC RAM CELL

[75] Inventors: Pallab K. Chatterjee; Geoff W. Taylor, both of Dallas; Al F. Tasch, Jr., Richardson; Horng-Sen Fu, Dallas, all of Tex.

[73] Assignee: Texas Instruments Incorporated, Dallas, Tex.

[21] Appl. No.: 921,933

[22] Filed: Jul. 3, 1978

[51] Int. Cl.² .................................... H01L 29/78
[52] U.S. Cl. ............................. 357/41; 357/23; 357/20
[58] Field of Search ........................ 357/41, 23, 20

[56] References Cited
U.S. PATENT DOCUMENTS

| | | | |
|---|---|---|---|
| 3,748,187 | 7/1973 | Aubuchon | 148/1.5 |
| 4,065,783 | 12/1977 | Ouyang | 357/41 |

Primary Examiner—Martin H. Edlow
Attorney, Agent, or Firm—Ronald A. Williamson; Richard L. Donaldson; William E. Hiller

[57] ABSTRACT

An MOS random access memory cell using the capacitance of a buried P-N junction as the storage element is formed by a process compatable with standard N-channel silicon gate manufacturing methods. The cell is fabricated using a method which consists of an implanted channel stopper underneath a thick field oxide, a buried, fully implanted charge storage element which also is the source of the cell transistor, self-aligned polysilicon gates, multilayer oxide and a thin film of metallization for interconnections. The vertical stacking of the charge storage and transfer elements and the increase in storage area to cell area ratio with the buried storage area provide a cell with very high packing density.

8 Claims, 14 Drawing Figures

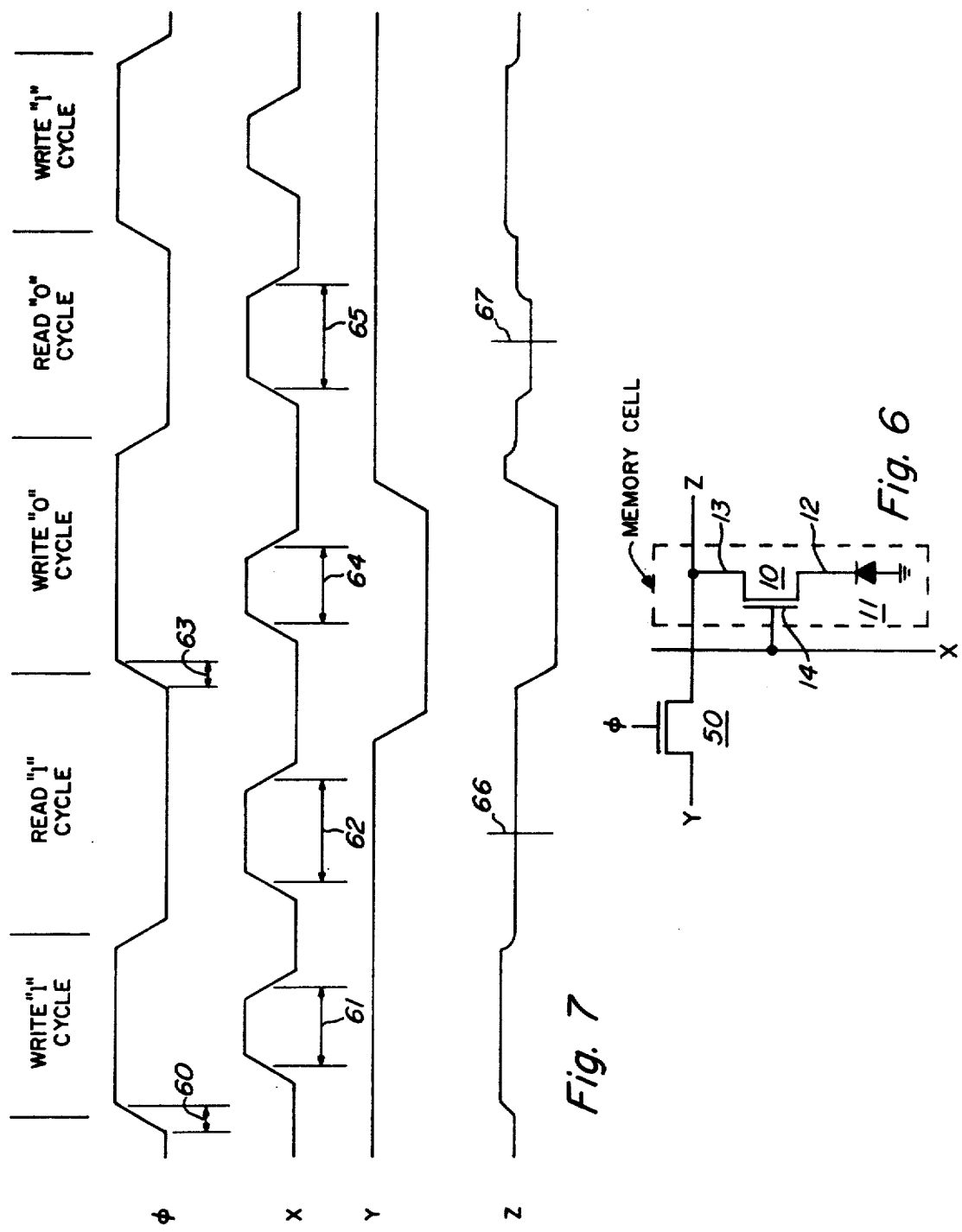

BURIED STORAGE PUNCH THROUGH DYNAMIC RAM CELL

BACKGROUND OF THE INVENTION

This invention relates to semiconductor memory devices and more particularly to an N-channel silicon gate MOS random access memory and a process for making said memory.

Semiconductor memory devices are widely used in the manufacture of digital equipment such as microprocessor systems and minicomputers. One of the key elements in this equipment in the random access memory or RAM, used for storing information and then recalling it. Originally RAMs were fabricated using bipolar technologies such as transistor-transistor logic or TTL but because of the trend toward increasing circuit densities TTL has given way to MOS technologies. More recently, RAMs have been fabricated using the N-channel silicon gate MOS technology because of its higher speed and higher circuit density. The standard memory cell used in these RAMs consists of an N-channel silicon gate MOS transistor and an MOS capacitor, the capacitor being used as a charge storage element. The use of the MOS capacitor requires surface chip area and consequently limits the minimum cell size. The VMOS technology with its grooves etched in the slice solves some of the cell size problems but has the disadvantage of a non-planar surface.

It is the principal object of the invention to provide a very small semiconductor random access memory cell. Another object of the invention is to provide a semiconductor random access memory cell with an increase in the ratio of available charge storage area to cell area. A further object of the invention is to provide a process for making a memory cell which is compatable with standard N-channel silicon gate MOS manufacturing techniques.

SUMMARY OF THE INVENTION

In accordance with an embodiment of the invention an MOS random access memory cell is provided that has implanted channel stoppers underneath thick field oxide, a buried storage element which is also the source of the cell transistor, self-aligned polysilicon gates, diffused drains, multilayer oxide, and a thin film of metallization for interconnections. The buried storage element provides a large increase in storage area to cell area ratio and is vertically stacked along with the cell transistor, or transistor element, all features providing very high packing density. In making the device a thin silicon oxide layer is grown and a silicon nitride layer deposited upon it. The areas for the channel stoppers are defined and implanted, and then a thick field oxide is grown consuming the silicon as it grows. The areas for the buried storage regions are defined and implanted. Gate oxide is grown and then a polysilicon layer is deposited and patterned to become gates. Phosphorus is diffused for drains of the cell transistors and sources and drains of other transistors on the chip. Multilayer oxide is deposited with contacts subsequently etched in it. The metal layer is deposited and patterned to form the leads. The nitride lead protection is deposited and openings for binding pads etched, completing the process.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

FIG. 6 is an electrical schematic of a memory cell being exercised; and

FIG. 7 is a graphic representation of voltages appearing at various points in the circuit of FIG. 6 plotted as a function of time.

DETAILED DESCRIPTION OF SPECIFIC EMBODIMENTS

Figure 1:
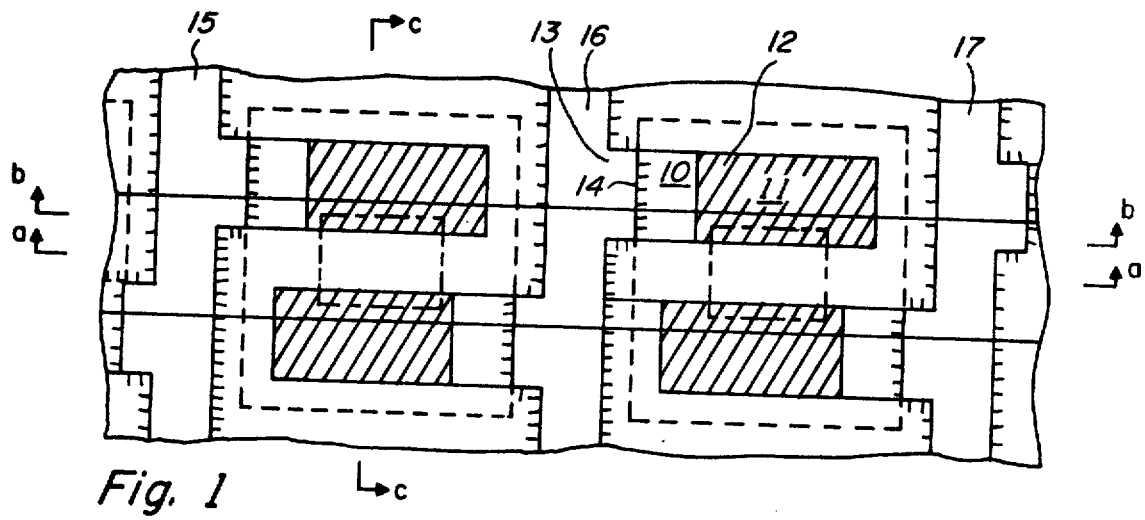
FIG. 1 is a greatly enlarged plan view of a small portion of a semiconductor chip showing the physical layout of a part of a RAM array made according to the invention.
Figure 2:
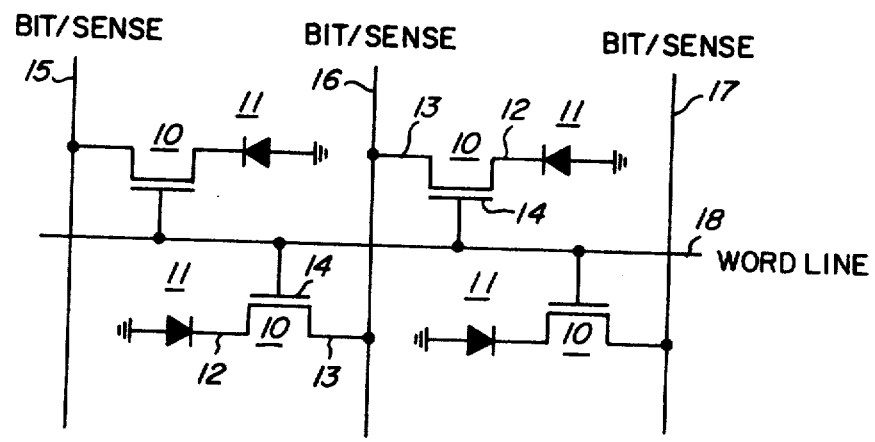
FIG. 2 is an electrical schematic diagram of the RAM of FIG. 1.

Referring to FIG. 1, a physical layout of a dynamic random access memory array is shown which is fabricated by the process which is the subject of the invention. The array consists of a large number of cells only four of which are shown. Each cell consists of an MOS transistor 10 which has a source 12, drain 13 and gate 14, and a diode storage element 11 whose N-electrode is the source 12 of the transistor 10. FIG. 2 is an electrical schematic diagram of the array with the parts numbered and laid out the same. The array formed on a silicon bar 20 would typically contain perhaps 16 K cells so the bar would be less than 200 mils on a side or 40,000 sq. mil area depending on the bit density. The four cells are a minute part of the bar, perhaps 2 mils wide.

Figure 3A:
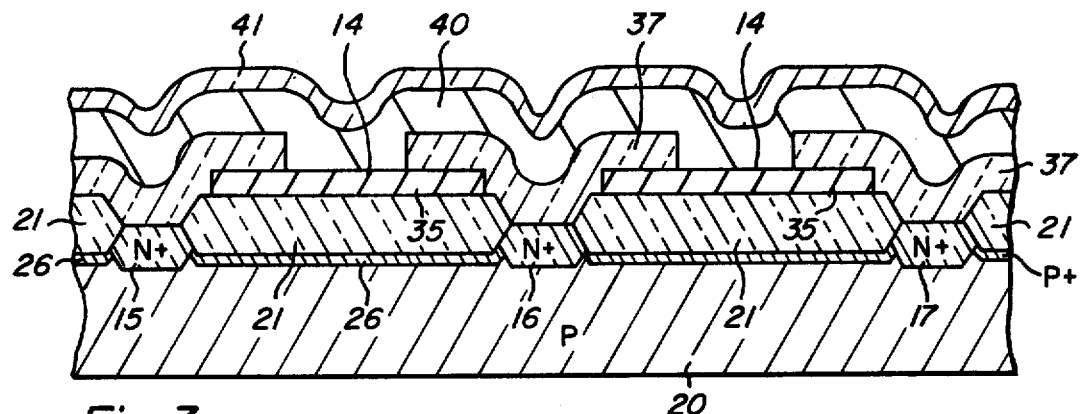
FIGS. 3a–3c are elevation views in section of the cell of FIG. 1, taken along the lines a—a, b—b, and c—c respectively.
Figure 3B:
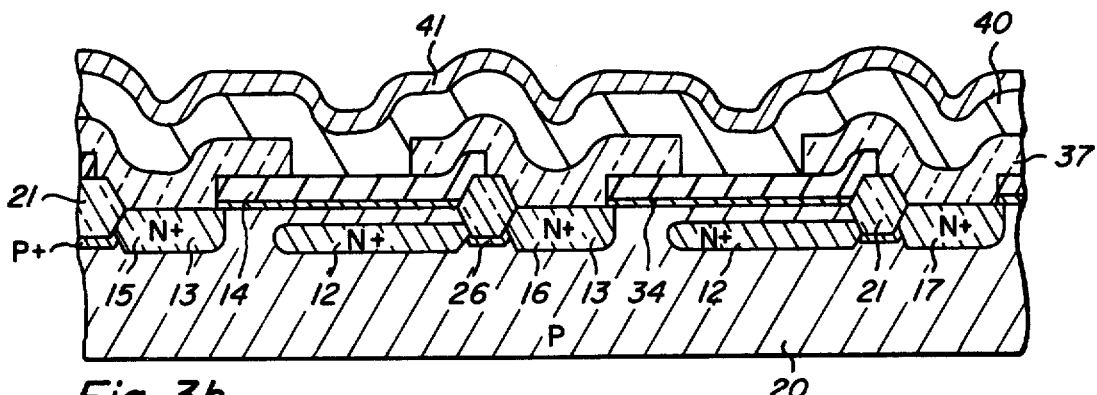
Figure 3C:
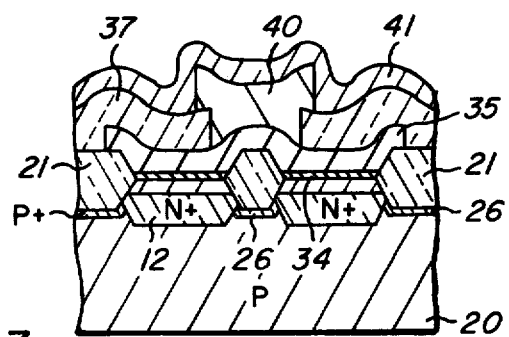

Section views of the cells of FIG. 1 showing the details of construction are illustrated in FIGS. 3a–3c. It should be kept in mind when examining the section views that not all geometries, junction depths and layer thicknesses are necessarily to scale, some having been enlarged or reduced where necessary to reflect features of the invention. The cells are formed by N+ implanted regions 12 which are part of the diode storage elements and the sources of the transistors, and N+ diffused regions 13 which are the drains of the transistors. The gates 14 are polysilicon but are connected to a metal strip 18 which is the word line. The drains are part of N+ diffused regions 15, 16, 17 which are the bit/sense lines. Thick field oxide 21 surrounds the diode storage elements 12 and is adjacent to the N+ diffused regions. A P+ boron-doped channel-stop region 26 is created under all areas of the thick field oxide.

Figure 4A:
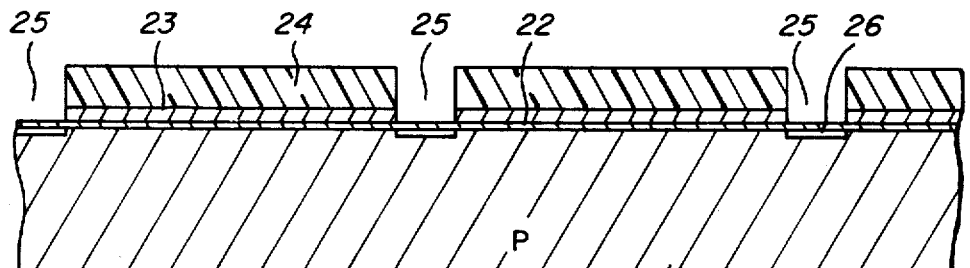
FIGS. 4a–4f are elevation views in section of the RAM array of FIGS. 1 and 3a–3d, at successive stages in the manufacturing process, taken generally along the line b—b in FIG. 1.

Referring now to FIGS. 4a–4f, a process for making the device of FIGS. 1 and 3a–3c will be described. The starting material is a slice of P-type monocrystalline silicon, perhaps 3 inches in diameter and 16 mils thick, cut on the <100> plane, of a resistivity of about 4 to 5 ohm-cm. In FIG. 3a or 4a, a wafer or body 20 represents a very small part of the slice, chosen as a representative sample cross-section. First, after appropriate cleaning, the slice is oxidized by exposing to steam in a furnace at an elevated temperature of perhaps 900 degrees C. to produce an oxide layer 22 of a thickness of about 1000 Angstroms. Next, a layer 23 of silicon nitride is formed by exposing the slice to an atmosphere of silane and ammonia in a furnace tube of perhaps 900 degrees C. This layer 23 is grown to a thickness of about 1400 Angstroms. A coating 24 of photoresist is applied to the entire top surface, then exposed to ultraviolet light through a mask which defines the desired pattern, and developed. This leaves areas 25 where nitride is to be etched away. The slice is subjected to a nitride etchant which removes the exposed part of the nitride layer 23 but does not remove the oxide layer 22 and does not react with the photoresist 24.

The slice is now subjected to an ion implant step, whereby boron atoms are implanted in the areas of silicon not covered by photoresist 24 and nitride 23. The photoresist could have been removed, but preferably is left in place as it masks the implant. Boron is an impurity which produces P-type conductivity, so a more heavily doped P+ region 26 will be produced in the surface. The oxide layer 22 is left in place during the implant because it prevents the implanted boron atoms form out-diffusing from the surface during subsequent heat treatment. The boron implant is a dosage of about $1 \times 10^{13}/cm^2$ at 100 KeV.

As will be seen, the region 26 does not exist in the same form in the finished device, because some of this part of the slice will have been consumed in the oxidation procedure.

Figure 4B:
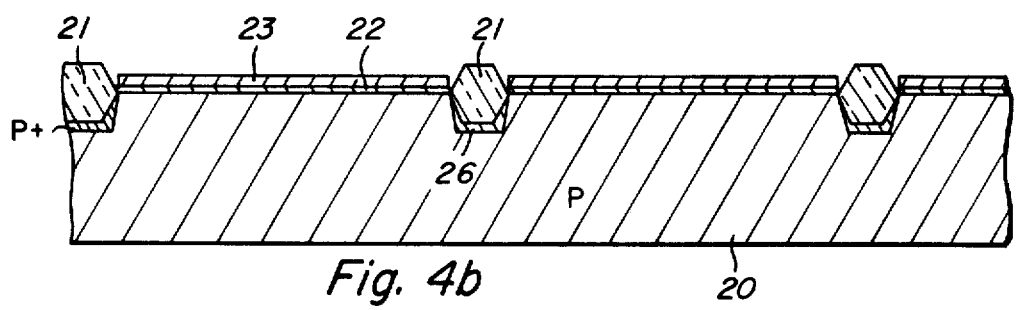

The photoresist 24 is removed and the following step in the process is formation of field oxide, which is done by subjecting the slices to steam or an oxidizing atmosphere at about 950 degrees C. for perhaps 6 hours. This causes a thick field oxide region or layer to be grown, and this region extends into the silicon surface because silicon is consumed as it oxidizes. The nitride layer 23 masks oxidation beneath it. The thickness of this layer 21 is about 10,000 Angstroms, half of which is above the original surface and half below. The boron doped P+ region 26 formed by implant will be partly consumed, but will also diffuse further into the silicon ahead of the oxidation front. Thus, a P+ region 26 will result which will be a channel stopper to prevent parasitic effects between devices in separate isolated areas. FIG. 4b reflects a cross-section of the slice at this point in the fabrication process.

Figure 4C:
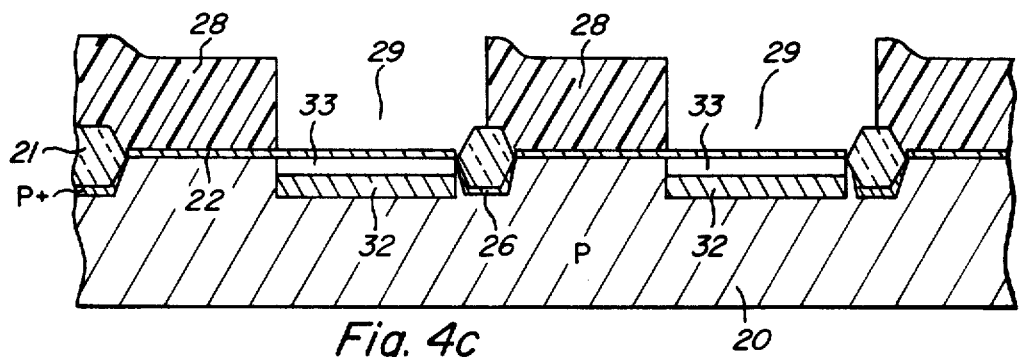
Figure 5:
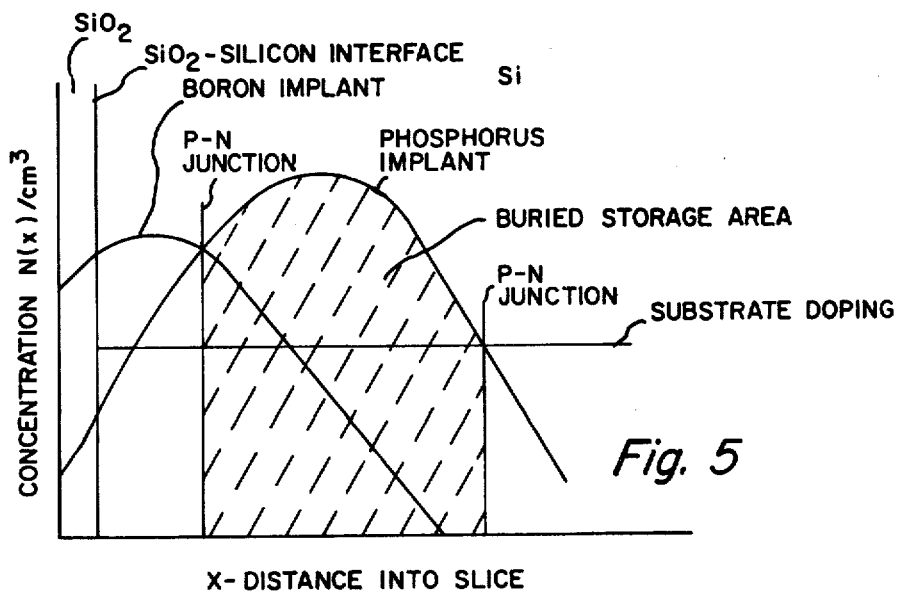
FIG. 5 is a graphic representation of the implanted boron and phosphorus concentrations for a buried storage area.

The next step in the process is the creation of the buried change storage diode regions 12, one of the features of the invention. The silicon nitride layer 23 is removed leaving the initial oxide 22 and the field oxide 21 intact. A coating 28 of thick photoresist is applied over the entire slice and exposed to ultraviolet light through a mask which exposes everything except those areas which are to become the diode storage regions. Upon developing, unexposed photoresist is removed from the slice leaving windows 29 where the slice is to be implanted. The slice is then subjected to successive implants which penetrate the slice in all areas except where there is photoresist 28. The first implant is phosphorus at a dose of about $5 \times 10^{14}/cm^2$ at 300 KeV which produces the N+ region 32 in the silicon. The second implant is boron at a dose of about $1 \times 10^{13}/cm^2$ at 40 KeV which produces the P-region 33, and leaves the slice as shown in FIG. 4c. The P-region is shallower than the N+ region and the combination of the two implants with the background doping produces the profile shown in FIG. 5. The purpose of the dual implant is to have an abrupt N+-P junction. In later cross-sections the implanted P-region 33 will not be shown since it is of the same impurity type as the substrate 20.

The photoresist is removed along with the initial oxide 22 and the next step in the formation of the gate oxide 34. The slice is placed in a steam ambient at about 900° C. for perhaps 8 min. which grows the gate oxide to a thickness of about 500 Å. The slice is next placed in a polysilicon reactor at 650° C. for perhaps 30 minutes to deposit a polysilicon layer 35 over the entire slice. Parts of this layer will become the gates of the MOS transistors. The layer is grown to a thickness of about 4000 Å. The polysilicon layer 35 is patterned by applying a layer of photoresist, exposing to ultraviolet light through a mask which exposes the areas which are to become gates, and then developing away the unexposed resist. This leaves resist above the areas which are to become gates. The slice is then placed in a plasma reactor which etches away the polysilicon which is not covered by photoresist.

Figure 4D:
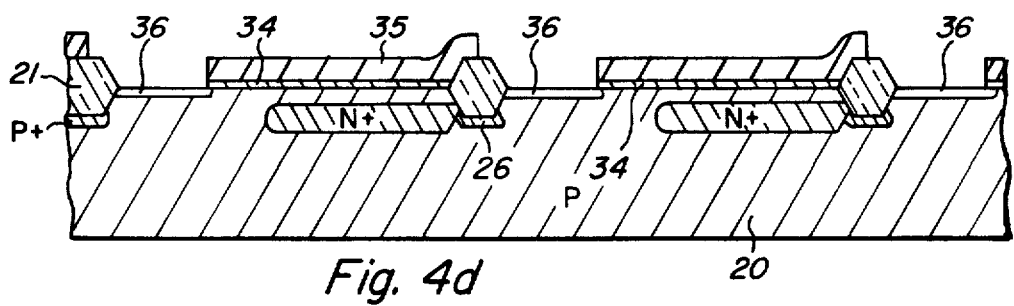

The next stage in the process is the formation of the MOS transistor drains 13 which are also the bit/sense lines 15, 16 and 17. The photoresist is removed and the slice is placed in hydrofluoric acid which removes parts of the gate oxide layer 34 that are not covered with polysilicon 35. The slice is then subjected to a high temperature furnace operation whereby phosphorus is "deposited" in a surface adjacent region in the drain areas. The furnace temperature is about 900° C. and the slice remains in the doping ambient for about 20 minutes, creating a deposited layer 36 with a resistance of about 20 ohms/square. Ohms/square is a well known term used to designate the resistance of thin, uniformly doped semiconductor layers. The excess deposited material is removed by subjecting the slices to dilute hydrofluoric acid, leaving the slice as shown in FIG. 4d.

Figure 4E:
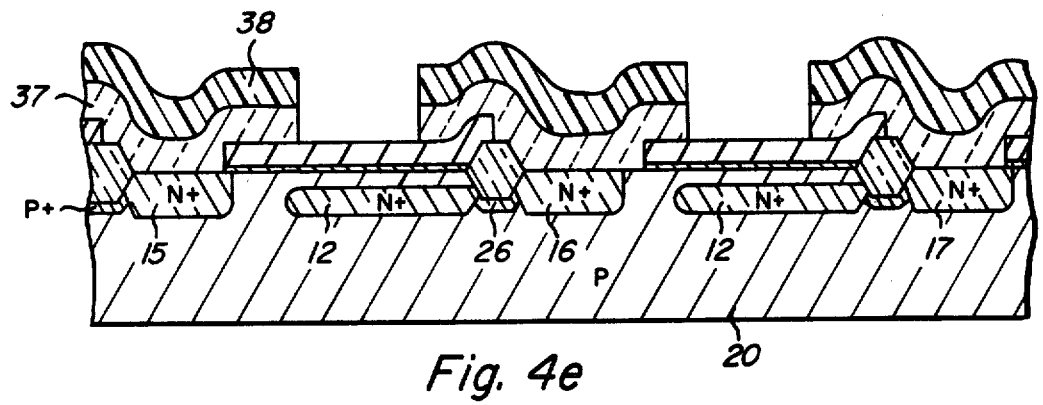

Next, a layer 37 of silicon oxide is deposited upon the entire slice by the reaction of silane and oxygen at about 400° C. This layer, which is doped with phophorus, is grown to a thickness of about 6500 A. This layer insulates the polysilicon from the subsequent metal level and is referred to as multilevel oxide. The slice is then placed in a phosphorus deposition furnace at about 1000° C. for perhaps 20 minutes to cause the multilevel oxide to flow and give a more nearly level surface topology. Note that during this step the phosphorus that was "deposited" in the drain areas further diffuses to its final depth, completing the formation of the drain areas. The contacts to the polysilicon are created next. The slice is covered with a layer 38 of photoresist and exposed to ultraviolet light through a mask which exposes everything except the contact areas. Upon developing unexposed photoresist is removed leaving the contact openings in the resist. The slice is then subjected to hydrofluoric acid which removes parts of the multilevel oxide 37 which are not covered by photoresist, leaving the slice as depicted in FIG. 4e.

The next stage of the fabrication process is the deposition, definition and sinter of the metal interconnects. The first step here involves the deposition of an aluminum layer 40 on the slice by use of a metal evaporator to a thickness of approximately 10,000 Angstroms. The slice is next covered by a photoresist coating which is applied over the entire slice, then exposed to ultraviolet through a mask which exposes the areas that are to become the metal leads. Upon developing, unexposed photoresist is removed leaving photoresist where the leads are to be formed. The slice is then subjected to an aluminum etch such as phosphoric acid which removes the aluminum layer 40 in all areas which are not covered by photoresist, but not attacking the multilevel oxide 37 or the photoresist. Upon removal of the photoresist the slice is annealed in hydrogen at about 450 degrees C. for perhaps 30 minutes.

Figure 4F:
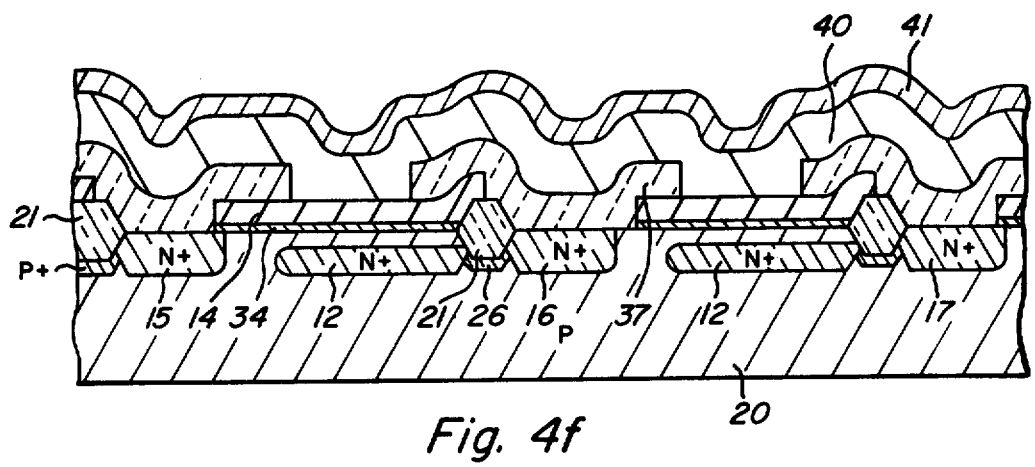

The last stage of the fabrication process is the definition and patterning of the protective nitride layer. A layer 41 of silicon nitride of about 3000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the openings over the bonding pads. Upon developing, unexposed photoresist is removed from areas above the bonding pads. The slice is then placed in an rf plasma reactor which removes the nitride which is not covered by photoresist, but does not remove the photoresist or attack the aluminum. The photoresist is then removed leaving the slice as shown in FIG. 4f. The operation of the memory cell is the same as that of the conventional memory cell containing an MOS capacitor as the storage element. The only difference is that the charge is being stored on a junction capacitor instead of an MOS capacitor.

FIG. 6 is a schematic of a memory cell and how the appropriate voltages are applied to and read from the cell. $\phi$ is a clock, Z is a sense line, X is a word line and Y is a bit line. Voltages are applied on all lines except Z where only reading is done. FIG. 7 is a timing diagram which indicates the sequence in which voltages are applied to and read from the cell during the write and read operations. The writing is done by the bit line Y through transistor 50 and the reading is done on the sense line Z. During the time 60 the drain 13 of the cell transistor 10 is positively charged by draining electrons from it. During the time 61 the storage diode 11 is reverse biased by draining electrons off of the buried storage element 12. This corresponds to having a "1" stored in the memory cell. After the transistors 10, 50 are turned off the voltages on the drain 13 and the buried storage element 12 remain high. Therefore, during the time 62 there is no significant voltage change on the sense line Z. During the time 63 the voltage on the drain 12 is lowered by the flow of electrons on to it. During the time 64 the storage diode 11 is zero biased by the flow of electrons to the buried storage element 12. This corresponds to having a "0" stored in the memory cell. After the cell transistor 10 is turned off the drain 13 of that transistor is again positively charged because the voltage on the bit line Y is brought to VDD before the transistor 50 is turned off. The drain stays positively charged when transistor 50 is turned off. During the time 65 electrons drain off of the buried storage element 12, reverse biasing the storage diode 11 and lowering the voltage on the drain 13. The difference in the voltage on the sense line at 66 and 67 represents the difference between a stored "1" and a stored "0".

During the time periods 61, 62, 64, 65 the cell transistor 10 is conducting but it does not operate in the normal manner since its source is the buried storage element 12. When the gate 14 is taken to VDD the depletion region under the gate punches through to the buried storage element 12, connecting the buried storage element to the drain 13 through the surface inversion channel under the gate 14 and the space charge limited punch-through region, and consequently allowing conduction between source and drain.

The cell structure that has been created is unique for N-channel MOS RAM's. Most RAM's use a cell composed of a single MOS transistor and a single MOS capacitor, the capacitor being used to store charge. The memory cell is in a logic "1" or "0" state depending on whether or not the capacitor is charged. The cell of the invention works the same way except charge is stored on the capacitance of a reverse biased P-N+ junction diode. The advantages of such a structure are that the charge storage regions and transfer elements 10 are vertically stacked. The buried storage region 12 also increases the packing density by providing a large increase in the storage area to cell area ratio for the cell since all six faces of the storage region 12 contribute to the capacitance. The charge leakage off the P-N junction should be less than that of an MOS capacitor since there are no surface leakage components, and consequently the time between refresh cycles could be longer.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications of embodiments as fall within the true scope of the invention.

What is claimed is:

1. A semiconductor device comprising:
    a substrate of a first conductivity type semiconductor material;
    a buried charge storage region of the opposite conductivity type disposed in said substrate wholly below the surface thereof;
    a second region of said opposite conductivity type disposed in said substrate in laterally spaced relation from said charge storage region, said second region opening onto the surface of said substrate and defining a current carrying electrode;
    an insulating layer of substantially uniform thickness on the surface of said substrate and disposed directly above the entire area of said charge storage region and the entire surface area of said substrate lying laterally between said charge storage region and said current carrying electrode; and
    a single conductive layer covering substantially said entire insulating layer and being in coextensive directly engaging relationship therewith throughout the extent of said insulating layer on said substrate surface;
    said insulating layer being a gate insulator, and said single conductive layer being the sole gate electrode of the device.

2. A device according to claim 1 wherein said insulating layer is silicon dioxide.

3. A device according to claim 1 wherein said conductive layer is polycrystalline silicon.

4. A device according to claim 1 further including means for electrically isolating said device, said isolation means comprising:
    a thick dielectric region in said substrate lying contiguous with at least one perimeter portion of said charge storage region and lying contiguous with at least one perimeter portion of said current carrying electrode; and a heavily doped region of said first conductivity type lying below and in contact with said thick dielectric region.

5. A device according to claim 4 wherein said thick dielectric region is silicon dioxide.

6. A device according to claim 1 further including a multilevel oxide upon said conductive layer and said current carrying electrode, said multilevel oxide having an aperture in registration with said conductive layer, and a metal strip upon said multilevel oxide including an interconnect portion penetratinhg said aperture and contacting said conductive layer.

7. A device according to claim 6 wherein said multilevel oxide is phosphorus doped silicon dioxide and said metal strip is aluminum.

8. A device according to claim 6 wherein said second region is a drain, said charge storage region is a source and the cathode of a diode, and said substrate is the anode of said diode.

* * * * *